United States Patent [19]

Kobayashi et al.

[11] Patent Number: 4,811,294

[45] Date of Patent: Mar. 7, 1989

[54] DATA INTEGRITY VERIFYING CIRCUIT FOR ELECTRICALLY ERASABLE AND PROGRAMMABLE READ ONLY MEMORY (EEPROM)

[75] Inventors: Kazuo Kobayashi; Takeshi Nakayama; Yasushi Terada, all of Itami, Japan

[73] Assignee: Mitsubishi Denki Kabushiki Kaisha, Tokyo, Japan

[21] Appl. No.: 876,914

[22] Filed: Jun. 20, 1986

[30] Foreign Application Priority Data

Jun. 21, 1985 [JP] Japan ................................ 60-136538

[51] Int. Cl.$^4$ ......................... G11B 7/00; G11B 11/40
[52] U.S. Cl. ................................... 365/189; 365/201; 365/185; 365/218; 371/21
[58] Field of Search ............... 365/189, 201, 218, 104, 365/94, 185; 371/21

[56] References Cited

U.S. PATENT DOCUMENTS 4,460,982 7/1984 Gee et al. ............................ 365/189
4,578,751 3/1986 Erwin ................................ 365/96 X
4,675,513 6/1987 Kuze ................................ 235/474 X

OTHER PUBLICATIONS

"An Enhanced 16K E$^2$PROM", L. Gee et al., *IEEE Journal of Solid-State Circuits*, vol. SC-17, No. 5, Oct. 1982.

Primary Examiner—Stuart N. Hecker
Assistant Examiner—Alyssa H. Bowler
Attorney, Agent, or Firm—Lowe, Price, LeBlanc, Becker & Shur

[57] ABSTRACT

An EEPROM provided with a write/erase checking circuit comprising, a data detector for determining whether one byte in an input data contains a "0" (representing that a memory cell is not in an erase state); an address latch circuit and a data latch circuit which latch the address and the input data, respectively, responsive to a detection signal from the data detector; a data read circuit which selects the memory cells according to the address stored in the address latch circuit and reads the data out of the memory cells at the data write checking; and a comparator which compares the data from the data read circuit with the data stored in the data latch circuit.

3 Claims, 5 Drawing Sheets

DATA INTEGRITY VERIFYING CIRCUIT FOR ELECTRICALLY ERASABLE AND PROGRAMMABLE READ ONLY MEMORY (EEPROM)

BACKGROUND OF THE INVENTION

1. Field of the Invention

The present invention relates to a semiconductor memory device. More specifically, the present invention relates to an improvement in a data write checking circuit in a 5V-only electrically erasable programmable read only memory referred as EEPROM hereinbelow.

2. Description of the Prior Art

FIG. 1 is a schematic block diagram showing a data write system configuration in a conventional EEPROM. Referring to FIG. 1, a conventional, page-mode operable semiconductor memory device, in which storage region is a memory cell array 1 constituted of EEPROM cells, includes a row address buffer 2 and a column address buffer 3 which receive a row address signal and a column address signal, respectively wherein these signals specify an address in the memory cell array 1 in the X-direction (row) and Y-direction (column), respectively, and an input buffer 8 which receives data to be written into a memory cell selected in accordance with the address signal.

A row address latch 4 and a row decoder 6 are provided in the X-direction path. The row address latch 4 receives row address signals from the row address buffer 2 and latches to hold the same. The row decoder 6 receives row address signals from the row address latch 4, and decodes the same to select a specified row by the row address signal in the memory cell array 1.

A column address latch 5 and a column decoder 7 are provided at the Y-direction path. The column address latch 5 receives, latches, and holds column address signals from the column address buffer 3. The column decoder 7 receives column address signals from the column address latch 5 and decodes the same to select a specified column by the column address signal in the memory cell array 1.

A data latch 9 and a column latch 10 are provided at the data input system. The data latch 9 receives, latches, and holds data from the input buffer 8. The column latch 10 can hold one page volume of data from the data latch 9, corresponding to the decoded signals from the column decoder 7.

A sense amplifier 11, a comparator 12, and a write/erase controller 13 are provided at a data write checking path. The sense amplifier 11 senses to amplify the data written into the memory cell array 1. The comparator 12 receives the data from the sense amplifier 11 and data latched in the data latch 9 to compare the same so as to check whether the written-in data is identical with the latched data. The write/erase controller 13 controls the write and the erase operation into the memory cell array 1.

It takes several to ten milliseconds to write data into a memory cell in an EEPROM device. Accordingly, when the data is written in byte by byte, like in a static RAM (random access memory), it takes several tens to 80 seconds to write data into all bits of a 64K bits EEPROM, having 8K words×8 bits configuration. In order to eliminate the above disadvantage, the page mode write function enabling to write several bytes at one time has been standardly provided in EEPROM devices having integration equal to or higher than 64K bits.

If the page mode function enables 16 bytes to be written as one page during one operation cycle, the period required to write data into all bits reduces to 1/16, and writing into all bits can be completed within 5 seconds.

FIG. 2 is a timing chart showing each control signal timing in a page mode. In FIG. 2, a signal $\overline{CE}$ represents an active low chip enable signal; a signal $\overline{WE}$, an active low write enable signal. Referring to FIGS. 1 and 2, the page mode operation is briefly described in the following. A write cycle in the page mode consists of two cycles. In this disclosure, one cycle is called an external write cycle and the other, an internal write cycle.

In the external write cycle the memory device can be controlled from the outside and data can be written into the memory device in the same way as that in static RAMs. The data written at this time, however, is not actually written into the memory cells, but only stored in the latches provided correspondingly to each column, or the column latch 10. Since a page cannot be turned over during the page mode write operation, the page, or the row address, must be held constant.

When the external write cycle is completed, the memory device does not receive the externally applied control signals $\overline{CE}$ and $\overline{WE}$, and the flow goes into the internal cycle, wherein the data stored in the column latch 10 are actually written into the memory cells.

FIG. 3 is a flow chart showing the operation flow of the page mode writing.

Referring to FIGS. 1 through 3, especially to FIG. 3, the write checking operation in the page mode writing is further described.

First, the external write cycle starts at the fall of both signals $\overline{CE}$ and $\overline{WE}$ (S1). At this time, a timer in the controller 13 is activated in response to the fall of the signal $\overline{WE}$, as shown by the arrow in FIG. 2, and the timer output turns to "H" to enable external writing. Under this condition, row and column addresses are input to the row address buffer 2 and the column address buffer 3, (S2).

Then, the row address latch 4 and the column address latch 5 latch the supplied addresses through the row address buffer 2 and the column address buffer 3, (S4).

Data are entered into the input buffer 8 at the rise of the signal $\overline{WE}$ (S6). The data are latched in the data latch 9 through the input buffer 8, and then, latched in the column latch 10, which is able to latch one page volume of data (S8). While the timer output continues to be at "H" (for 200 microseconds), this cycle repeats while holding the row address constant (S10), and one page volume of data are latched to the column latch 10 byte by byte. Writing data into the column latch 10 is automatically terminated after 200 microseconds by the timer even if all data of one page volume are not latched to the column latch 10, and then, the internal write cycle starts.

At this time, the signal "Ready/$\overline{Busy}$" (not shown in the figure) generated synchronizing with the timer output changes from "H" to "L", and the access from the outside is ignored.

The one page volume of data which has been written into the addressed memory cells are erased under the control of the write/erase controller 13 before the data write into the addressed memory cells starts.

Under the erased state, the memory transistor in the memory cell has electrons injected into its floating gate and indicates the positive threshold voltage.

In the following description, this erased state is regarded as the state wherein the information "1" is memorized. When the electrons are conversely discharged from the floating gate of the memory transistor; that is, the transistor indicates the negative threshold voltage, this situation is regarded as a state wherein the information "0" is memorized.

After the one page volume of information is erased, one-byte data are read from the last memory cells in the memory cells included in the addressed one page under the control of the controller 13 and the read-out data are compared with "1"s in the comparator 12 through the sense amplifier 11. The erase checking of one page volume of data is completed when there is coincidence in the above comparison (S12).

After the erase operation of the one page volume of data is confirmed, the one page volume of data latched in the column latch 10 are written into the page specified by the row address (S14).

All memory cells in the addressed one page into which data are to be written are set to "1" by the previous erase operation (S12) so that the actual write operation ts each required memory cell to "0."

After completing the external write cycle, the addresses latched in the row address latch 4 and the column address latch 5 and the data latched in the data latch 9 correspond to the addresses and data of one byte of the last input data in the page, respectively.

Next, under the control of the controller 13, the information in the memory cells selected by the last address is read through the sense amplifier 11 (S16), and the information is compared with the data latched in the data latch 9, at the comparator 12 (S18).

If the read-out information coincides with the latched data, the page write is terminated (S20). In the case of incoincidence, the operation flow returns to the step 14 and the write cycle is repeated.

In a conventional semiconductor memory, write checking is executed using the one byte data last written into the page. Accordingly, when all of one byte data entered last are equal to "1", the corresponding memory cells indicate the same conditions as in the erased state so that it is impossible to confirm whether or not writing data into this page is completed.

The circuit to check the data write/erase operation in an EEPROM is disclosed in "An Enhanced 16K E²-PROM", L. GEE et al., IEEE JOURNAL OF SOLID-STATE CIRCUITS VOL. SC-17, NO. 5, OCT. 1982, pp. 828–832.

This prior art, however, discloses a circuit that checks data write/erase operations in the byte mode writing only. It discloses nothing about a circuit that confirms data write/erase operations in the page mode.

SUMMARY OF THE INVENTION

It is the primary object of the present invention to eliminate the above described disadvantages and provide a semiconductor memory device which can reliably check a writing operation using one byte memory cells into which data including a "0" are written.

A semiconductor memory device according to the present invention comprises a data detecting means which detects whether or not a predetermined value, preferably "0", which indicates the memory cell is not in the erased state, is contained in the input data, an address latch means and a data latch means which latch the address of the memory cell for said input data including the predetermined value to be written and the input data, respectively, responsive to the detection signal from said data detecting means, a data read means which selects a memory cell based on the address stored in said address latch means to read out data therefrom at the write checking, and a comparing means which compares the data from said data read means with the data stored in said data latch means.

Preferably, the operation of the address latch means at the write checking is controlled by the inverted signal of the Ready/Busy signal which is internally generated for controlling the external access to the memory cell array. Moreover, the address latch means and the data latch means are preferably provided independently from the ordinary address latch for holding addresses and the data latch for holding data.

The semiconductor memory device according to the present invention detects whether or not one byte in the input data includes a "0." When the data includes a "0", the address and the data corresponding to the input data are selectively latched to the address latch and the data latch. At the write checking, the data are read based on the address latched in the address latch. These read data are compared at the comparator with the data stored in the data latch so that the write checking can be reliably executed.

These object and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
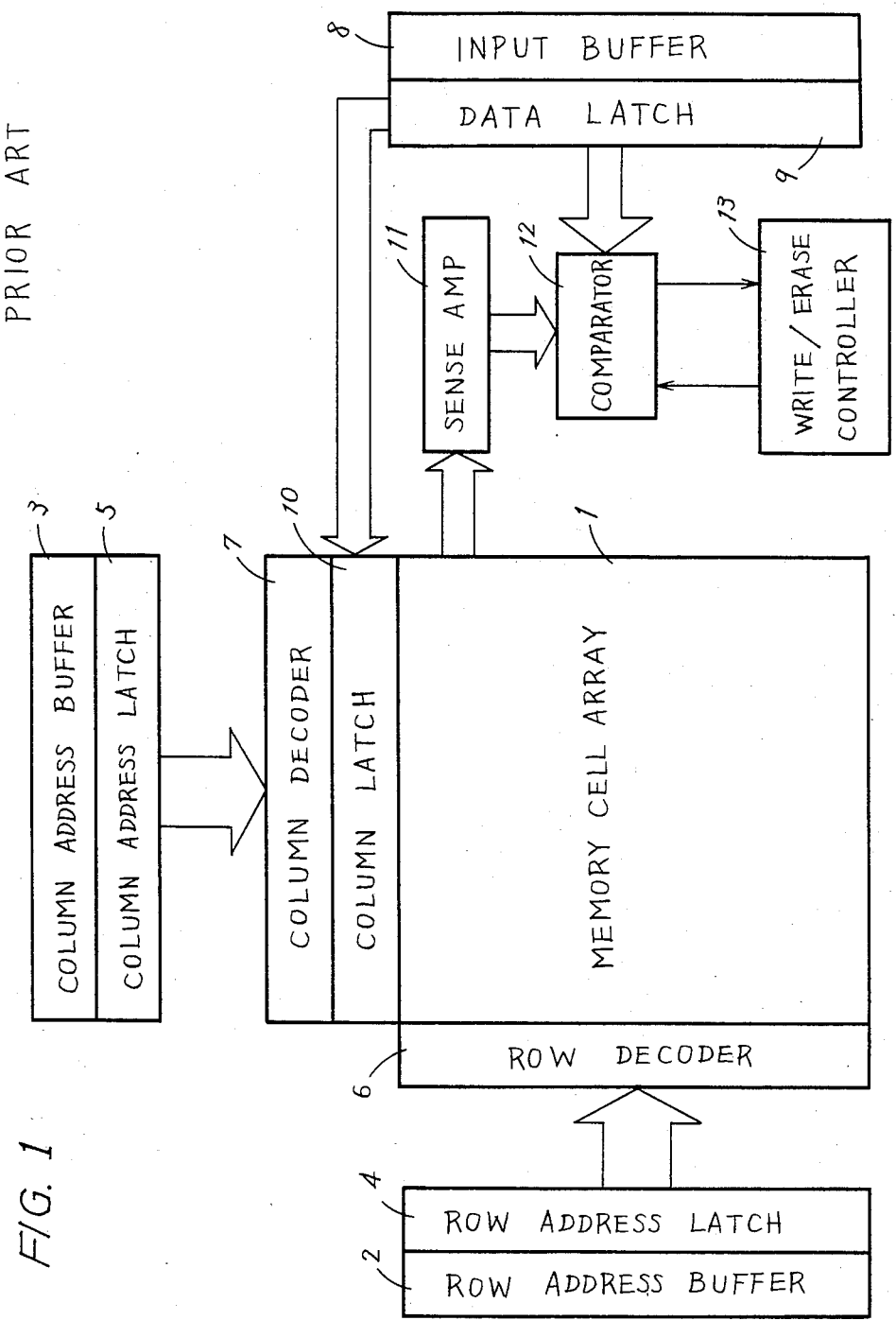
FIG. 1 is a schematic block diagram showing a conventional semiconductor memory configuration.
Figure 2:
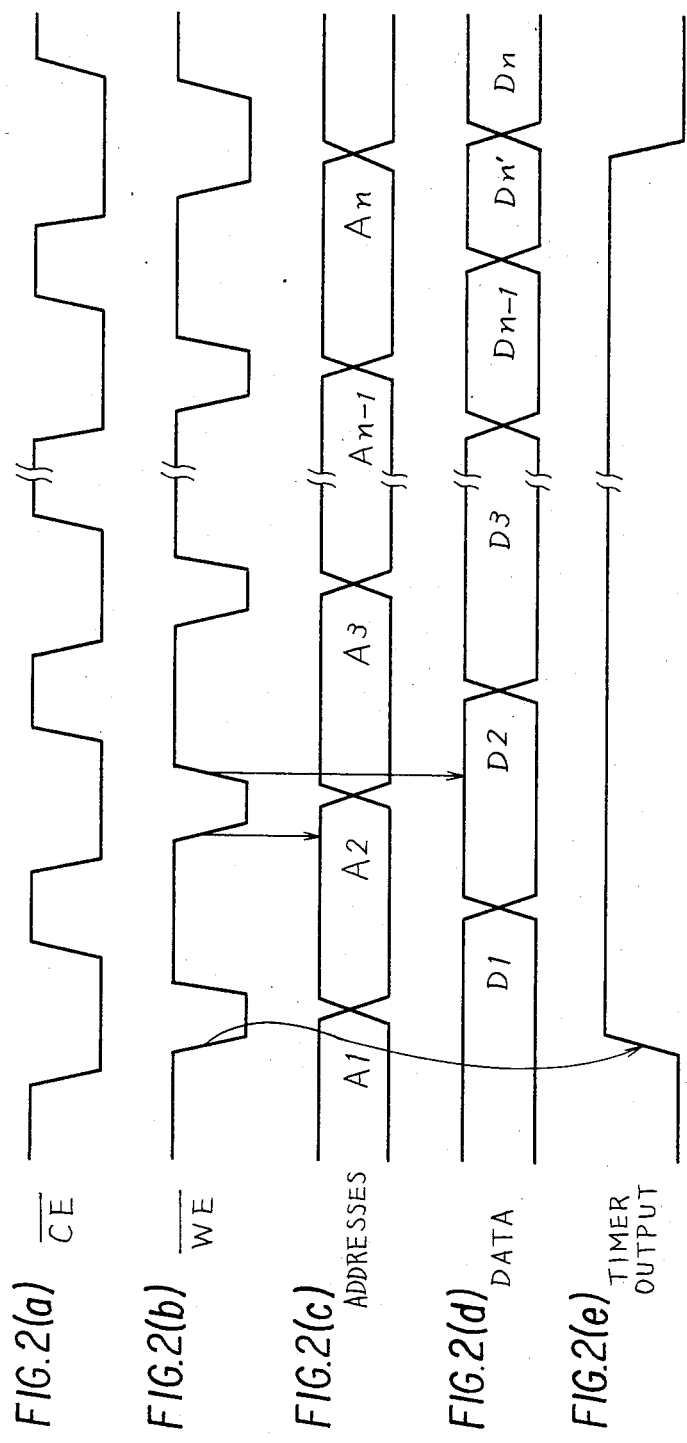
FIGS. 2(a)–2(e) are timing charts showing each control signal timing in a semiconductor memory.
Figure 3:
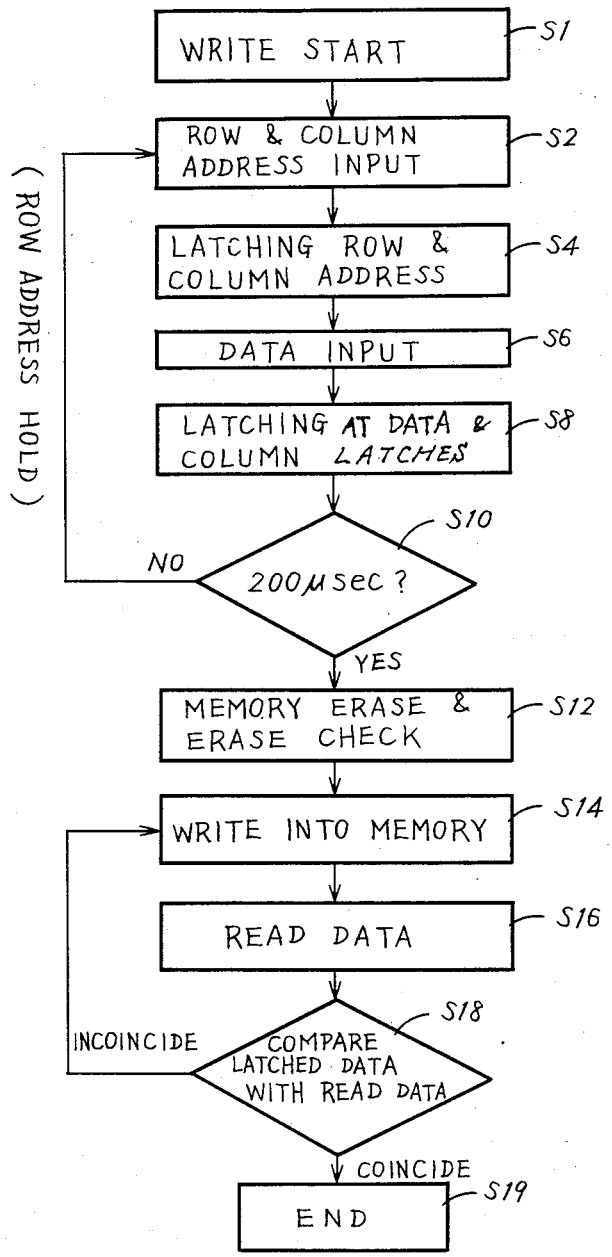
FIG. 3 is a flow chart showing a data write operation flow in a conventional semiconductor memory.

Referring to the drawings, an embodiment of the present invention is described in the following.

Figure 4:
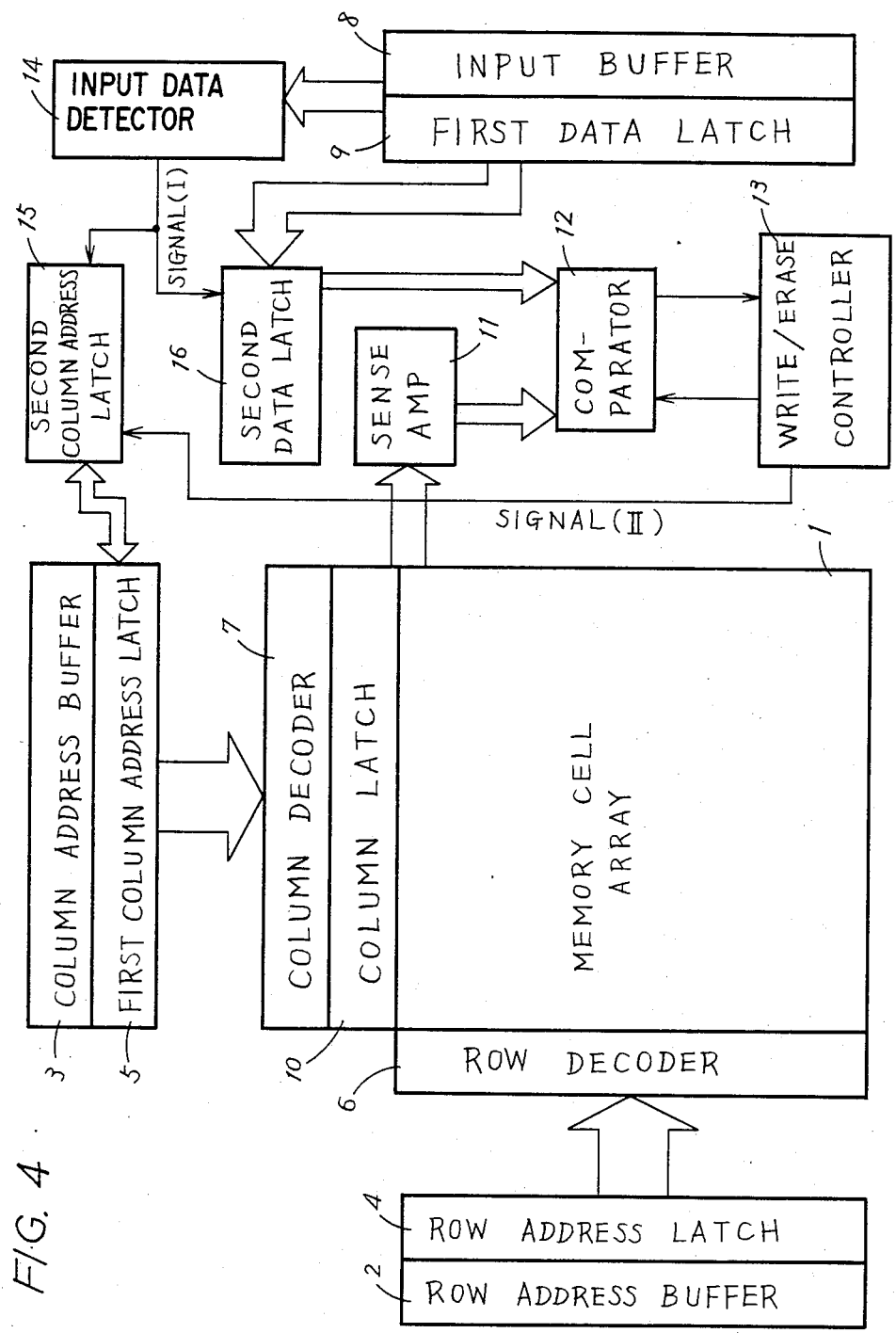
FIG. 4 is a schematic block diagram showing a semiconductor memory configuration according to an embodiment of the present invention.

FIG. 4 is a schematic block diagram showing a semiconductor memory configuration according to an embodiment of the present invention. Referring to FIG. 4, the semiconductor memory device according to the present invention comprises an input data detector 14 which detects whether or not a data of one byte includes a "0", wherein the one-byte data are entered through the input buffer 8 which receives the data to be written, a second column address latch 15 which latches to hold the column addresses from the first column address latch 5 responsive to the detection signal (I) from the input data detector 14, and a second data latch 16 which latches to hold the data from the first data latch 9 responsive to the detection signal (I) from the input data detector 14, in addition to the conventional semiconductor memory configuration.

In the configuration, the first column address latch 5 and the first data latch 9 are latches for holding address and data respectively provided in a conventional semiconductor memory.

The second column address latch 15 and the second data latch 16 are configured so that they latch the address and the input data, respectively only when the input data includes "0."

In addition, in order to control the transfer operation of the column addresses between the first column address latch 5 and the second column address latch 15, an inverted signal (II) of the Ready/Busy signal is sent to the second column address latch 15 from the write/erase controller 13. Under the external write cycle, the column address is transferred from the first column address latch 5 to the second column address latch 15 by the inverted signal (II). On the other hand, under the internal write cycle, the column address is transferred from the second column address latch 15 to the first column address latch 5 by the inverted signal (II).

The data from the first data latch 9 are also transferred to the column latch 10, although this flow is not shown in FIG. 4 for the simplicity of the figure. The comparator 12 is configured to compare the read data from the memory cell array through the sense amplifier 11 with the data latched in the second data latch 16, under the control of the controller 13.

Figure 5:
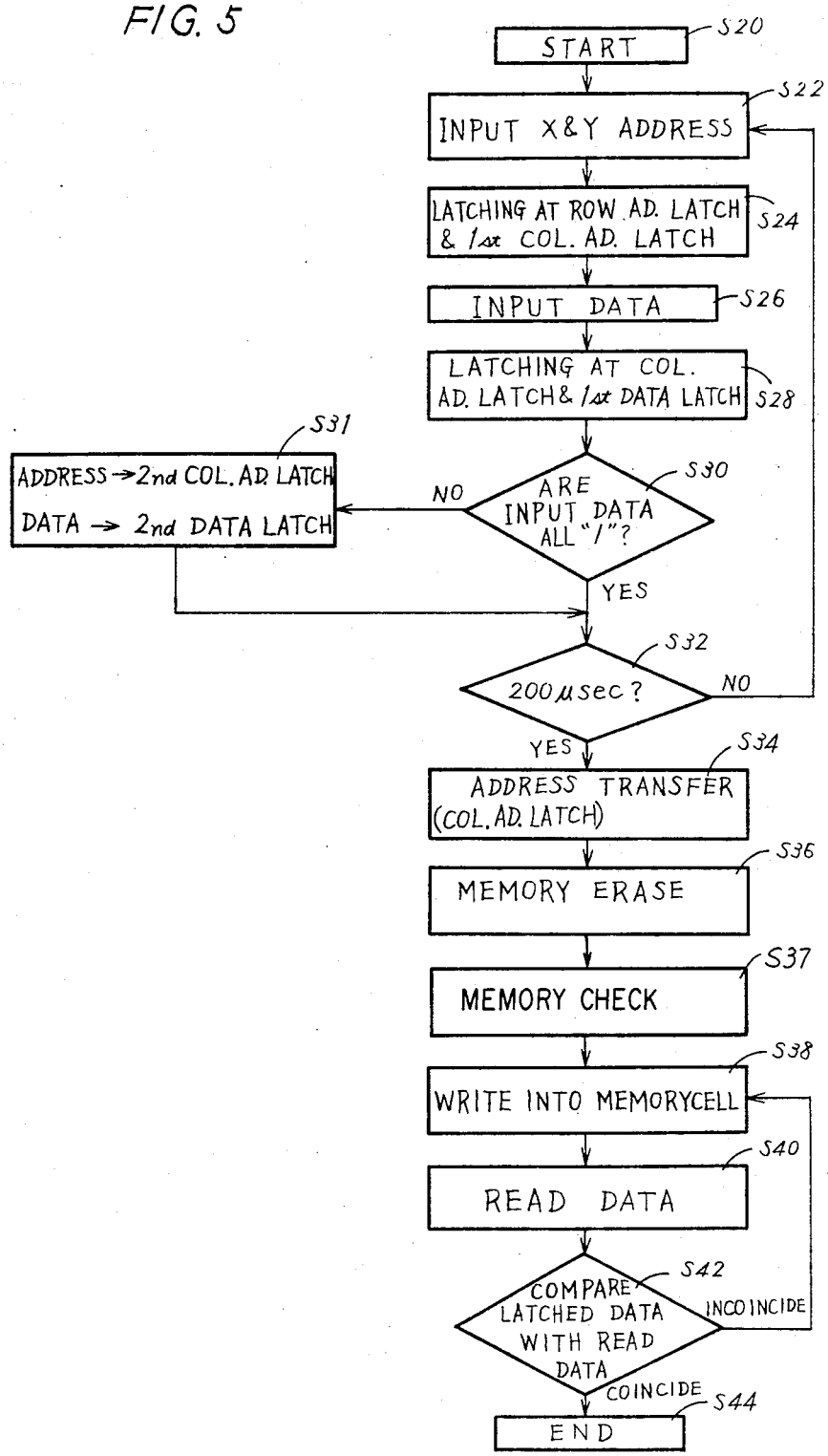
FIG. 5 is a flow chart showing a data write operation flow in an embodiment of the present invention.

FIG. 5 is a flow chart showing the write checking operation flow in a semiconductor memory device according to the embodiment of the present invention. Referring to FIGS. 4 and 5, the operation is described in the following.

As similar to a conventional memory device, the write operation starts at the fall of the signal $\overline{WE}$ when the signal $\overline{CE}$ is active in "L" (S20).

Responding to this operation start, the row address buffer 2 and the column address buffer 3 receive the row and column addresses (S22) and transfer the received addresses to the row address latch 4 and the first column address latch 5, respectively. The row address latch 4 and first column address latch 5 latch each receives the address signal to latch (S24). Next, the input buffer 8 receives the data to be written (S26).

Responsive to the rise of the signal $\overline{WE}$, the data to be written are transferred from the input buffer 8 to the first data latch 9 and the column latch 10, and the data are latched in them (S28). At the same time, the data entered to the input buffer 8 are also supplied to the input data detector 14, and the detector 14 determines whether or not the data include a "0" (S30). The input data detector 14 transfers the signal (I) to the second column address latch 15 and the second data latch 16, depending on the content of the received data.

If the input data include a "0", the second data latch 16 latches the data received from the first data latch 9 responsive to the detection signal (I).

The second column address latch 15 receives the inverted signal (II) of the Ready/Busy signal generated from the write/erase controller 13 and receives the column address from the first column address latch 5 responsive to the signal (II). Accordingly, the second column address latch 15 also latches the transferred column address, responsive to the "0" detection signal (I) from the input data detector 14 and to the signal (II) (S31).

This cycle is repeated for 200 microseconds under the control by the output of the timer included in the write/erase controller 13 (S32).

One page volume of the input data are latched in the column latch 10 by this cycle. This operation of the column latch 10 to latch the one page volume of data is the same as in the conventional memory. The above described operation is the external write cycle and the Ready/Busy signal is in the "H" state for this period.

When an output from the timer included in the controller 13 turns to "L", the Ready/Busy signal also turns to "L" synchronizing with the timer output so that access from the outside is ignored and the internal write cycle starts.

The second column address latch 15 transfers the latched column address therein to the first column address latch 5, responsive to the inverted signal (II) of "H" (S34).

At the same time, the information in the page specified in the external write operation, or the information in the memory cells on the identical row into which the data should be written, is erased under the control of the write/erase controller 13. Subsequently, one-byte data from the last memory cell in the one page are read through the sense amplifier 11 under the control of the controller 13, and the data are by the comparator 12 whether all of them are equal to "1." If the read data contain a "0", the erase operation is repeated again. When all of the read data are equal to "1", the operation flow advances to the next step (S36).

The data latched in the column latch 10 are written into the selected memory cells in the same page under the control of the write/erase controller 13 (S38).

After the write operation of all data in the column latch 10 is completed, the write checking operation is executed under the control of the controller 13 as follows:

The column address for the last input data including a "0" in the page, has been transferred to the first column address latch 5 from the second column address latch 15.

According to the transferred address, access to the memory cells is executed so that the one-byte data in the memory cells is read after the write completion and transferred to the comparator 12 through the sense amplifier 11 (S40).

The data latched in the second data latch 16 are also transferred to the comparator 12. The comparator 12 compared the read data through the sense amplifier 11 with the data latched in the second data latch 16 (S42).

If those data do not coincide with each other, the operation flow returns to the step 38 and the write operation is repeated. When those data coincide with each other, the write operation is terminated (S44).

As described above, the write checking operation is executed for the memory cells of one byte into which at least a "0" is written.

In the above described embodiment, the memory device is configured so that the read data are compared with the data latched in the second data latch 16. The same advantage, however, can be attained by the configuration wherein the read data are compared with the data latched in the column latch 10, instead of the data in the second data latch 16.

As apparent from the above description, a semiconductor memory device according to the present invention is configured to hold a one-byte address and data containing a "0" out of the one page volume of data to be written and to execute the write checking operation using the data including a "0" so that the write operation into the memory cell including a "0" is surely checked and the reliability of writing is improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A page mode addressable semiconductor memory device comprising a data integrity verifying circuit for an electrically erasable and programmable read only memory (EEPROM), said EEPROM operable at least to write data into a memory cell selected by a externally supplied column and row address signal, wherein said semiconductor memory device is operative in a page mode to confirm data write/erase operations, said semiconductor memory device comprising:

first data latch means for latching data to be written, said data externally supplied to said first data latch means;

data detecting means for receiving said externally supplied data from said first data latch means to detect whether said externally supplied data contains at least one bit of a predetermined value indicating that said memory cell is not in an erased state;

second data latch means for receiving the data from said first data latch means to latch the data from said first data latch means, said second data latch means responsive to a detection signal from said data detection means;

first address latch means for receiving and latching said column sand row address signal;

first signal generating means for generating a first operation timing signal;

second address latch means for receiving an latching said column and row address signal from said first address latch means, said second address latch means responsive to said first operation timing signal from said first signal generating means and to said detection signal from said data detection means;

address read means for reading a column and row address latched in said second address latch means, said address read means responsive to said first operation timing signal;

second signal generating means for generating a second operation timing signal;

data read means for reading the data out of at least one memory cell specified by the column and row address signal read out by said address read means, said data read means responsive to said second operation timing signal from said second signal generating means;

comparing means for receiving the data from said data read means and the last byte of data including at least one bit of said predetermined value from said second data latch means to compare said data from said data read means and said last byte of data from said second data latch means for conscience; and control means for enabling a write operation into a memory cell when the data compared in said comparing means do not coincide and not enabling a write operation into a memory cell when the data compared in said comparing means coincide.

2. The semiconductor memory device in accordance with claim 1, wherein said memory cell is an electrically erasable and programmable read only memory, and said predetermined value detected by said data detecting means represents the data of not erased state in said electrically erasable and programmable read only memory.

3. The semiconductor memory device in accordance with claim 1, wherein said first operation timing signal is a complementary signal of the Ready/$\overline{\text{Busy}}$ signal which controls said data write into said memory cell.

* * * * *